(12) United States Patent
Ye et al.

(10) Patent No.: US 10,796,943 B2
(45) Date of Patent: Oct. 6, 2020

(54) MANUFACTURING METHOD OF SEMICONDUCTOR STRUCTURE

(71) Applicant: UNITED MICROELECTRONICS CORP., Hsin-Chu (TW)

(72) Inventors: Yi-Liang Ye, Kaohsiung (TW); Chun-Wei Yu, Tainan (TW); Yu-Ren Wang, Tainan (TW); Shi-You Liu, Kaohsiung (TW); Shao-Hua Hsu, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/181,354

(22) Filed: Nov. 6, 2018

(65) Prior Publication Data
US 2020/0144102 A1    May 7, 2020

(51) Int. Cl.
*H01L 21/762* (2006.01)
*H01L 21/3115* (2006.01)
*H01L 21/308* (2006.01)
*H01L 21/306* (2006.01)

(52) U.S. Cl.
CPC ...... *H01L 21/76237* (2013.01); *H01L 21/308* (2013.01); *H01L 21/30604* (2013.01); *H01L 21/31155* (2013.01)

(58) Field of Classification Search
CPC ................................................. H01L 21/76237
See application file for complete search history.

(56) References Cited

U.S. PATENT DOCUMENTS

| | | | |
|---|---|---|---|
| 4,534,824 A * | 8/1985 | Chen | H01L 21/033 257/499 |
| 6,323,532 B1 * | 11/2001 | Joachim | H01L 21/76237 257/374 |
| 7,737,009 B2 | 6/2010 | Lindsay | |
| 7,781,303 B2 | 8/2010 | Zhao | |
| 2002/0055236 A1 * | 5/2002 | Chen | H01L 21/76237 438/437 |
| 2002/0086498 A1 * | 7/2002 | Oda | H01L 21/76237 438/424 |
| 2014/0127879 A1 * | 5/2014 | Peng | H01L 29/0649 438/437 |
| 2016/0013183 A1 * | 1/2016 | Basker | H01L 27/0886 257/401 |

(Continued)

*Primary Examiner* — Moazzam Hossain
(74) *Attorney, Agent, or Firm* — Winston Hsu

(57) ABSTRACT

A manufacturing method of a semiconductor structure includes the following steps. A patterned mask layer is formed on a semiconductor substrate. An isolation trench is formed in the semiconductor substrate by removing a part of the semiconductor substrate. A liner layer is conformally formed on an inner sidewall of the isolation trench. An implantation process is performed to the liner layer. The implantation process includes a noble gas implantation process. An isolation structure is at least partially formed in the isolation trench after the implantation process. An etching process is performed to remove the patterned mask layer after forming the isolation structure and expose a top surface of the semiconductor substrate. A part of the liner layer formed on the inner sidewall of the isolation trench is removed by the etching process. The implantation process is configured to modify the etch rate of the liner layer in the etching process.

12 Claims, 4 Drawing Sheets

(56) References Cited

U.S. PATENT DOCUMENTS

2019/0157072 A1* 5/2019 Arceo de la Pena ........................ H01L 21/0234
2020/0058736 A1* 2/2020 Singh ................ H01L 21/76831

* cited by examiner

US 10,796,943 B2

MANUFACTURING METHOD OF SEMICONDUCTOR STRUCTURE

BACKGROUND OF THE INVENTION

1. Field of the Invention

The present invention relates to a manufacturing method of a semiconductor structure, and more particularly, to a manufacturing method of a semiconductor structure including an isolation trench.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Generally, isolation structures, such as shallow trench isolations, are used to isolate electronic devices formed on wafers, and it is more difficult to form the isolation structures as the devices and the isolation structures become smaller. The structure and/or the manufacturing method of the isolation structure will influence electronic devices adjacent to the isolation structure and has to be modified for improving the electrical performance and/or the manufacturing yield of the electronic devices.

SUMMARY OF THE INVENTION

A manufacturing method of a semiconductor structure is provided in the present invention. An implantation process is performed to a liner layer formed in an isolation trench before forming an isolation structure on the liner layer for modifying an etching rate of the liner layer in a subsequent etching process.

According to an embodiment of the present invention, a manufacturing method of a semiconductor structure is provided. The manufacturing method includes the following steps. A patterned mask layer is formed on a semiconductor substrate. An isolation trench is formed in the semiconductor substrate by removing a part of the semiconductor substrate. A liner layer is conformally formed on an inner sidewall of the isolation trench. An implantation process is performed to the liner layer. The implantation process includes a noble gas implantation process. An isolation structure is at least partially formed in the isolation trench after the implantation process. An etching process is performed to remove the patterned mask layer after forming the isolation structure and expose a top surface of the semiconductor substrate. A part of the liner layer formed on the inner sidewall of the isolation trench is removed by the etching process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Figure 1:
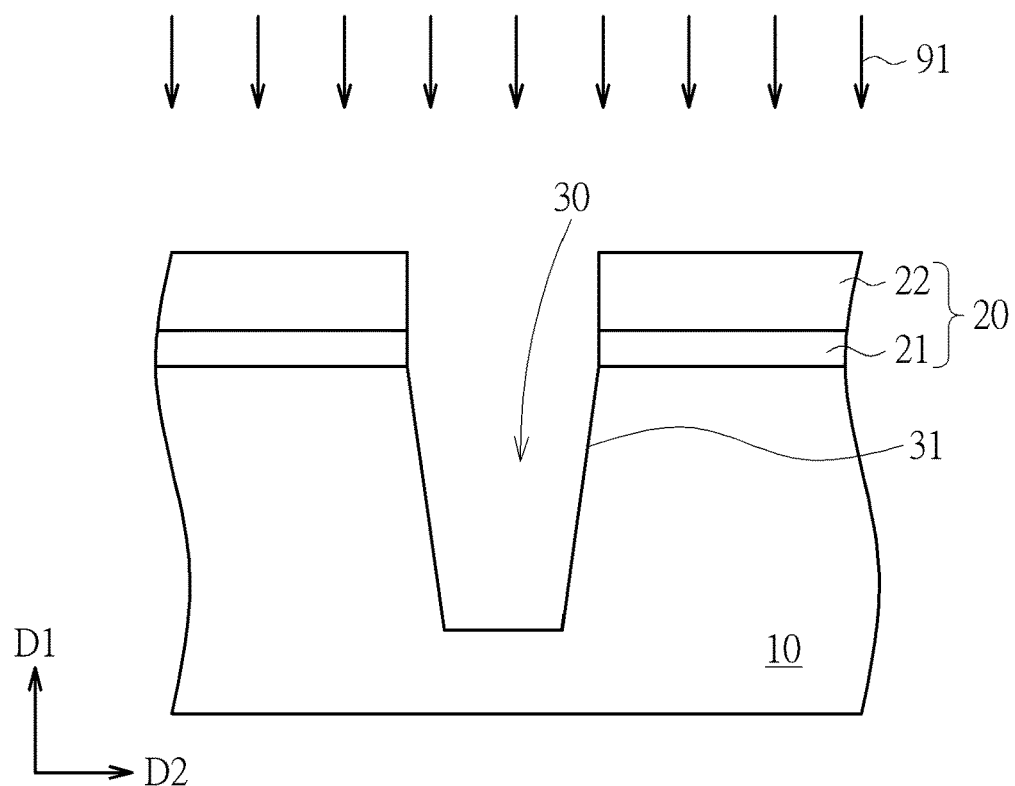
Figure 2:
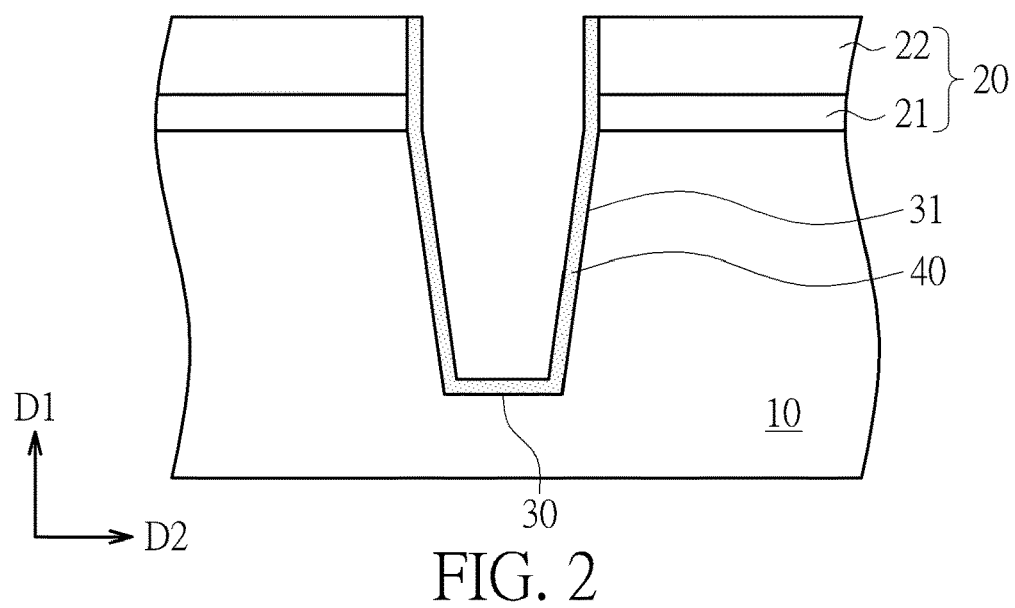
Figure 3:
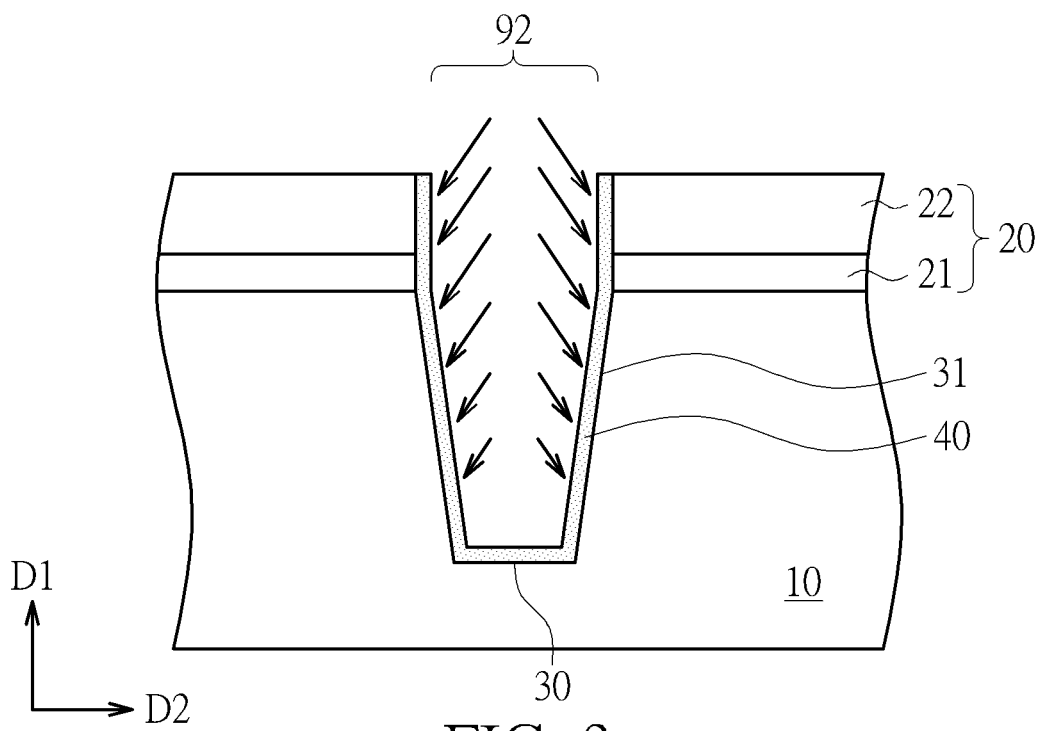
Figure 4:
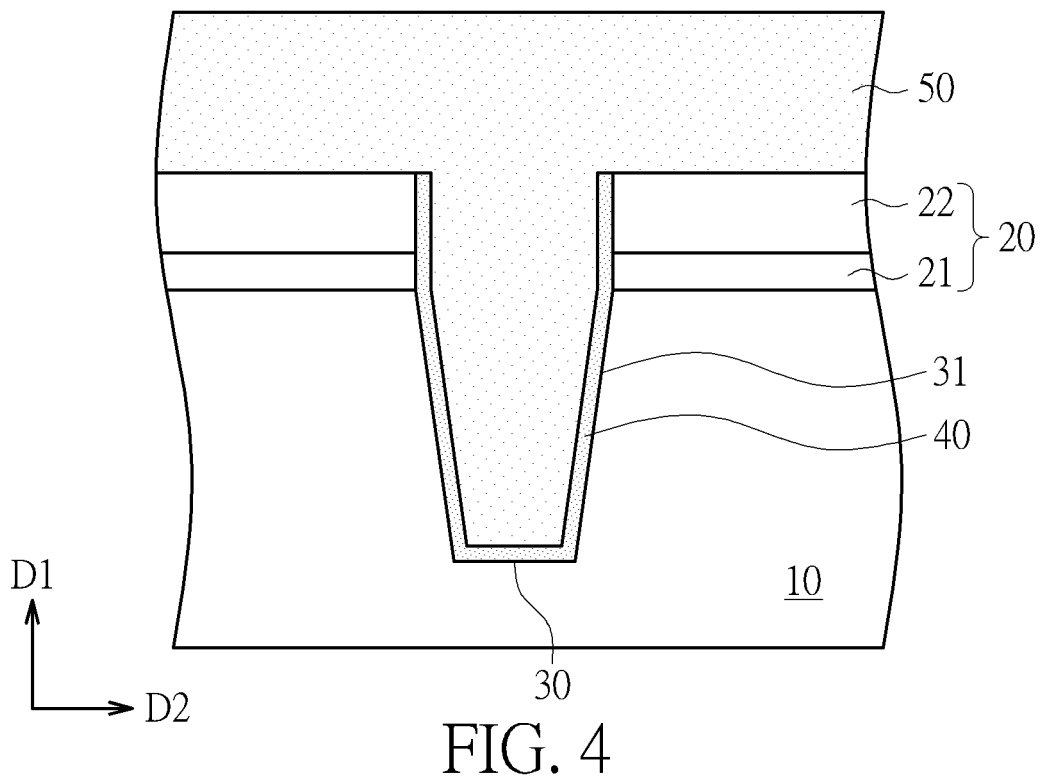
Figure 5:
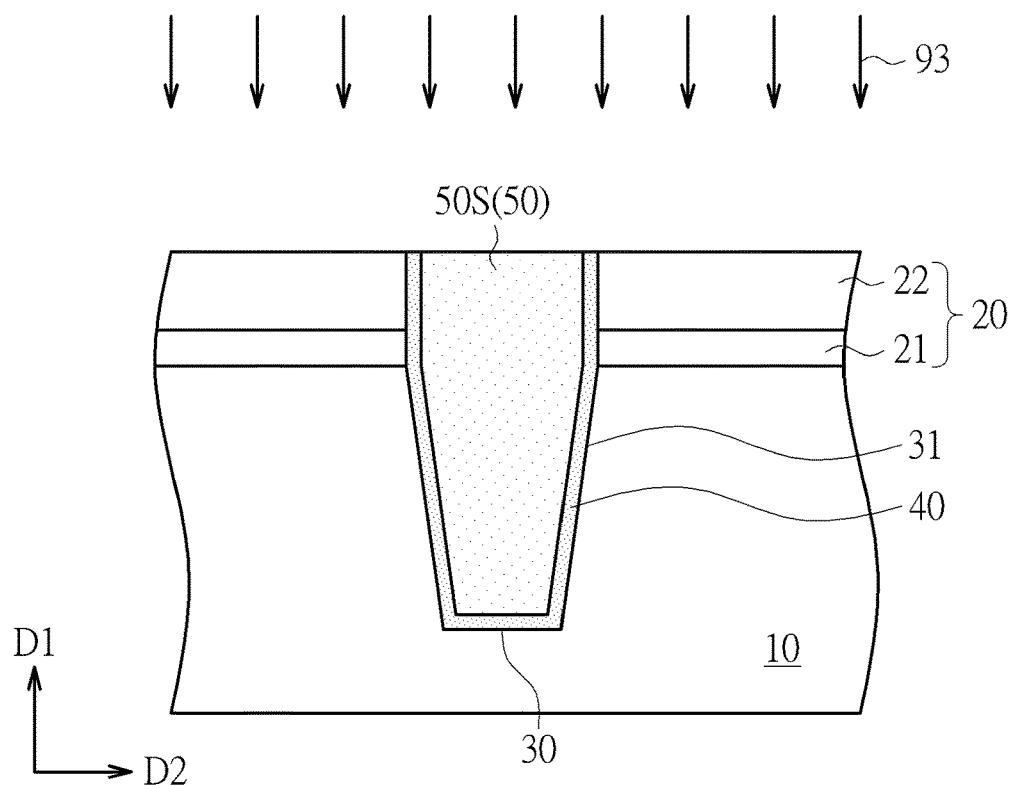
Figure 6:
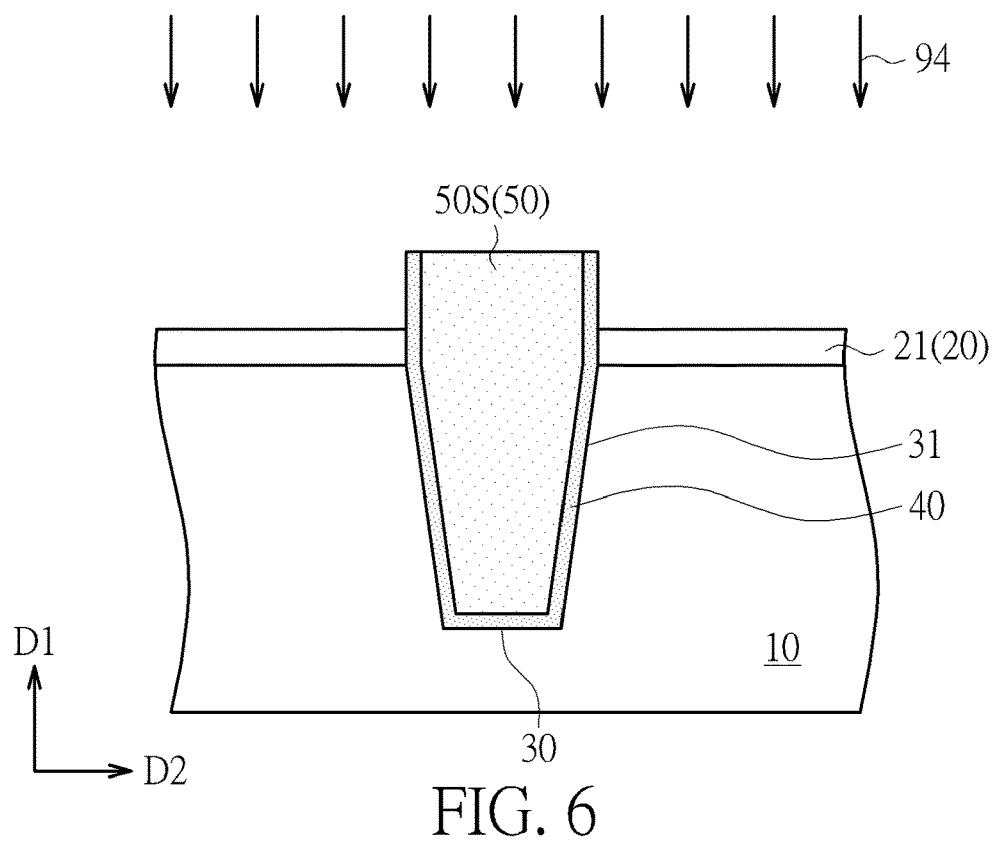
Figure 7:
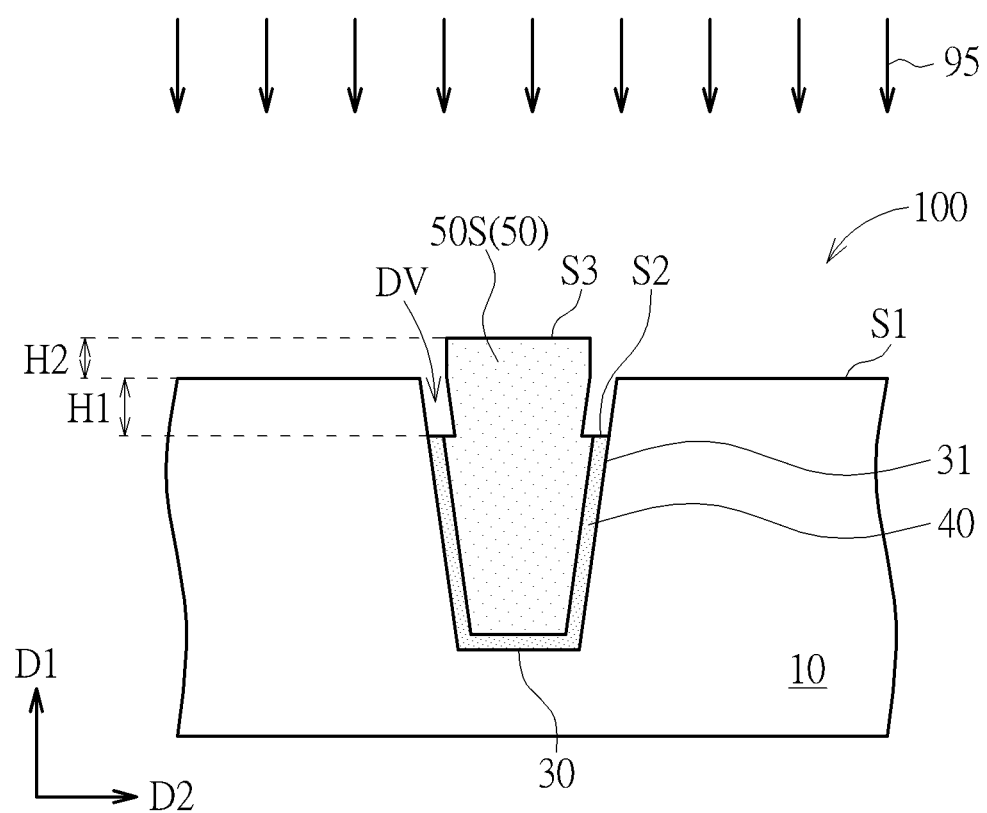

Please refer to FIGS. 1-7. FIGS. 1-7 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. The manufacturing method of the semiconductor structure in this embodiment may include the following steps. As shown in FIG. 1, a semiconductor substrate 10 is provided. The semiconductor substrate 10 may include a silicon substrate, a silicon germanium substrate, a silicon-on-insulator (SOI) substrate, or substrates including other suitable semiconductor materials. An isolation trench 30 may be formed in the semiconductor substrate 10 by removing a part of the semiconductor substrate 10. The isolation trench 30 may extend downwards into the semiconductor substrate 10 without penetrating the semiconductor substrate 10, and a bottom and an inner sidewall 31 of the isolation trench 31 may expose a part of the semiconductor substrate 10. In some embodiments, a patterned mask layer 20 may be formed on the semiconductor substrate 10 before the step of forming the isolation trench 30. In some embodiments, the patterned mask layer 20 may be used as a mask in an etching process (such as a first etching process 91 shown in FIG. 1) for removing a part of the semiconductor substrate 10 and forming the isolation trench 30, but not limited thereto. In other words, the isolation trench 30 may be formed corresponding to an opening of the patterned mask layer 20 in a thickness direction of the semiconductor substrate 10 (such as a first direction D1 shown in FIG. 1). The first etching process 91 may include a dry etching process, a wet etching process, or the combination thereof. In some embodiments, the patterned mask layer 20 may be formed by performing a patterning process using a patterned photoresist layer (not shown) before the first etching process 91, and the patterned photoresist layer may be removed before the first etching process 91 or removed by the first etching process 91, but not limited thereto. The patterned mask layer 20 may be a single layer structure or a multiple layer structure of dielectric materials and/or conductive materials. The dielectric materials mentioned above may include silicon oxide, silicon nitride, silicon oxynitride, silicon carbonitride, or other suitable dielectric materials, and the conductive materials mentioned above may include metallic materials or other suitable conductive materials. In some embodiments, the patterned mask layer 20 may include a first mask layer 21 and a second mask layer 22 stacked in the first direction D1, and the material composition of the second mask layer 22 may be different from the material composition of the first mask layer 21. For example, the first mask layer 21 may be an oxide layer, such as a silicon oxide layer, and the second mask layer 22 may be a nitride layer, such as a silicon nitride layer, but not limited thereto.

As shown in FIG. 1 and FIG. 2, a liner layer 40 may be formed conformally on the inner sidewall 31 of the isolation trench 30 after the first etching process 91, and the isolation trench 30 is not fully filled with the liner layer 40. The liner layer 40 may include a dielectric material, such as an oxide dielectric material or other suitable dielectric materials. The liner layer 40 may be formed by a thermal treatment, a deposition process (such as a chemical vapor deposition process or a physical vapor deposition process), or other suitable film formation processes. For example, the liner layer 40 may include a thermal oxide layer, but not limited thereto. In some embodiments, the liner layer 40 may be further formed on sidewalls of the first mask layer 21 and/or sidewalls of the second mask layer 22, but not limited thereto.

As shown in FIG. 3, an implantation process 92 may be performed to the liner layer 40. In some embodiments, the implantation process 92 may be performed with a tilt angle for treating at least the liner layer 40 disposed on the inner sidewall 31 of the isolation trench 30, but not limited thereto. In some embodiments, the implantation process 92 may include a noble gas implantation process for implanting noble gas atoms in the liner layer 40. In other words, the noble gas is not used as a carrier gas in the implantation process 92, and the noble gas atoms are implanted in liner layer 40 for changing the physical structure of the liner layer 40. In some embodiments, the liner layer 40 may become porous and/or softened by the implantation process 92, and some properties of the liner layer 40 (such as an etching rate of the liner layer 40 in a subsequent etching process) may be changed by the implantation process 92. For example, the implantation process 92 may include a xenon (Xe) implantation process, a helium (He) implantation process, a neon (Ne) implantation process, an argon (Ar) implantation process, or any combination thereof, but not limited thereto.

As shown in FIGS. 3-5, an isolation structure 50S is formed after the implantation process 92, and the isolation structure 50S may be at least partially formed in the isolation trench 30. The method of forming the isolation structure 50S may include but is not limited to the following steps. In some embodiments, an isolation material 50 may be formed in the isolation trench 30 and formed on the patterned mask layer 20 after the implantation process 92, and the isolation trench 30 may be fully filled with the liner layer 40 and the isolation material 50. In some embodiments, the isolation material 50 may include a spin on dielectric (SOD) material, an insulation material formed by a chemical vapor deposition (CVD) process, or other suitable insulation materials formed by other processes. The SOD material mentioned above may include silicon oxide, polysilazane, or other suitable materials. The insulation material formed by the CVD process mentioned above may include silicon oxide, silicon oxide based materials, or other suitable materials. In some embodiments, the material composition of the isolation material 50 is different from the material composition of the liner layer 40. Subsequently, a planarization process 93 may be performed to remove the isolation material 50 on the top surface of the patterned mask layer 20 and form the isolation structure 50S partly in the isolation trench 30 and partly outside the isolation trench 30. In some embodiments, the planarization process 93 may include a chemical mechanical polishing (CMP) process or other suitable planarization approaches, and the CMP process may stop on the top surface of the patterned mask layer 20, but not limited thereto. The topmost surface of the isolation structure 50S, the topmost surface of the liner layer 40, and the topmost surface of the patterned mask layer 20 may be substantially coplanar after the planarization process 93.

As shown in FIGS. 5-7, an etching process may be performed to remove the patterned mask layer 20 after the isolation structure 50S is formed and expose a top surface of the semiconductor substrate 10 (such as a first top surface S1 shown in FIG. 7), and a part of the liner layer 40 formed on the inner sidewall 31 of the isolation trench 30 may be removed by the etching process. Specifically, when the patterned mask layer 20 is composed of the first mask layer 21 and the second mask layer 22 different from the first mask layer, multiple etching steps may be applied to remove the patterned mask layer 20. For example, in some embodiments, a second etching process 94 may be performed to remove the second mask layer 22, and a third etching process 95 may be performed after the second etching process 94 to remove the first mask layer 21, but not limited thereto. The third etching process 95 and the second etching process 94 may respectively include a dry etching process, a wet etching process, or the combination thereof, and the third etching process 95 may be different from the second etching process 94. For example, the third etching process 95 may include a wet etching process using dilute hydrofluoric acid (DHF) when the first mask layer 21 is an oxide layer, but not limited thereto. A semiconductor structure 100 shown in FIG. 7 may be obtained by the manufacturing processes described above, and the isolation structure 50S and the liner layer 40 may form a shallow trench isolation in the semiconductor substrate 10, but not limited thereto.

As shown in FIG. 7, a part of the semiconductor substrate 10 may be exposed by the inner sidewall 31 of the isolation trench 30 after the third etching process 95 because a part of the liner layer 40 formed on the inner sidewall 31 of the isolation trench 30 may be removed by the third etching process 95. In other words, the liner layer 40 formed on the inner sidewall 31 of the isolation trench 30 may be recessed by the third etching process 95, and a recess DV may be formed above the liner layer 40 and formed between the isolation structure 50S and the semiconductor substrate 10 in a direction horizontally extending from the center of the isolation structure 50S towards the semiconductor substrate 10 (such as a second direction D2 shown in FIG. 7). The recess DV may be regarded as a divot horizontally surrounding a portion of the isolation structure 50S, but not limited thereto.

In some embodiments, the topmost surface of the liner layer 40 (such as a second top surface S2 shown in FIG. 7) may be lower than the topmost surface of the semiconductor substrate 10 (e.g. the first top surface S1) in the thickness direction of the semiconductor substrate 10 (e.g. the first direction D1) after the third etching process 95, and a height difference between the topmost surface of the liner layer 40 and the topmost surface of the semiconductor substrate 10 (such as a first height difference H1 shown in FIG. 7) in the thickness direction of the semiconductor substrate 10 (e.g. the first direction D1) may be larger than or equal to 6 nanometers after the third etching process 95, but not limited thereto. More area of the semiconductor substrate 10 may be exposed by the inner sidewall 31 of the isolation trench 30 as the recess DV becomes deeper. In some embodiments, a gate structure (not shown) may be formed on the semiconductor structure 100, the contact area between the gate structure and the semiconductor substrate 10 may be increased by the deeper recess DV, and electrical performance of a semiconductor device including the gate structure and the semiconductor structure 100 may be enhanced accordingly. However, the recess DV cannot be too deep for the concern of etching residue in the patterning process of the gate structure. Therefore, the depth of the recess DV (e.g. the first height difference H1) has to be controlled within a specific range, and a part of the liner layer 40 still surrounds a lower portion of the isolation structure 50S horizontally in the isolation trench 30.

In some embodiments, the implant implantation process 92 shown in FIG. 3 and performed to the liner layer 40 may be used to modify the etching rate of the liner layer 40 in the etching process for removing the patterned mask layer 20, such as the third etching process 95 described above. For example, the etch rate of the liner layer 40 in the third etching process 95 may be increased by the implantation process 92 preferably, but not limited thereto. In some embodiments, the etch rate of the liner layer 40 in the third etching process 95 may be higher than the etch rate of the isolation structure 50S in the third etching process 95 for keeping a specific height difference between the isolation structure 50S and the semiconductor substrate 10 when forming a deeper recess DV. For example, the topmost surface of the isolation structure 50S (such as a third top surface S3 shown in FIG. 7) may be higher than the topmost surface (e.g. the first top surface S1) of the semiconductor substrate 10 in the thickness direction of the semiconductor substrate 10 (e.g. the first direction D1) after the third etching process 95. The height difference between the topmost surface of the isolation structure 50S and the topmost surface of the semiconductor substrate 10 in the first direction D1 (such as a second height difference H2 shown in FIG. 7) has to be large enough for providing required isolation effects. Defects, such as a short circuit between source/drain structures (not shown) subsequently formed on the semiconductor substrate 10, will be generated when the second height difference H2 is not large enough.

Therefore, in some embodiments, the etch rate of the isolation structure 50S in the third etching process 95 is lower than the etch rate of the liner layer 40 in the third etching process 95 preferably for keeping the second height difference H2 within a specific range and increasing the first height difference H1. In other words, the etch rate of the isolation structure 50S in the third etching process 95 will be higher than the etch rate of the liner layer 40 in the third etching process 95 when the liner layer 40 is not treated by the implant implantation process 92 described above, and the second height difference H2 will not be large enough when forming a deeper recess DV. In some embodiments, the height difference between the topmost surface of the liner layer 40 and the topmost surface of the semiconductor substrate 10 (e.g. the first height difference H1) in the thickness direction of the semiconductor substrate 10 (e.g. the first direction D1) may be larger than the height difference between the topmost surface of the isolation structure 50S and the topmost surface of the semiconductor substrate 10 (e.g. the first height difference H2) in the thickness direction of the semiconductor substrate 10 (e.g. the first direction D1) after the third etching process 95 for increasing the contact area between the gate structure and the semiconductor substrate 10 and enhancing the electrical performance of the semiconductor device composed of the semiconductor structure 100, the gate structure, and the source/drain structures described above, but not limited thereto.

To summarize the above descriptions, according to the manufacturing method of the semiconductor structure in the present invention, the implantation process is performed to the liner layer formed on the inner sidewall of the isolation trench before forming the isolation structure on the liner layer for modifying the etching rate of the liner layer in the etching process of removing the patterned mask layer. The step height between the isolation structure and the semiconductor substrate may be kept and the recess above the liner layer may become deeper for improving the electrical performance and the manufacturing yield of a semiconductor device including the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
    forming a patterned mask layer on a semiconductor substrate, wherein the patterned mask layer comprises a first mask layer and a second mask layer disposed on the first mask layer;
    forming an isolation trench in the semiconductor substrate by removing a part of the semiconductor substrate;
    forming a liner layer conformally on an inner sidewall of the isolation trench;
    performing an implantation process to the liner layer, wherein the implantation process comprises a noble gas implantation process configured to implant noble gas atoms in the liner layer;
    forming an isolation structure at least partially in the isolation trench after the implantation process; and
    performing an etching process to remove the patterned mask layer after the isolation structure is formed and expose a top surface of the semiconductor substrate, wherein a part of the liner layer formed on the inner sidewall of the isolation trench is removed by the etching process, and a part of the semiconductor substrate is exposed by the inner sidewall of the isolation trench after the etching process, wherein the etching process comprises:
        a first etching step configured to remove the second mask layer; and
        a second etching step configured to remove the first mask layer and performed after the first etching step, wherein a topmost surface of the liner layer is higher than a topmost surface of the first mask layer in a thickness direction of the semiconductor substrate after the first etching step and before the second etching step.

2. The manufacturing method of the semiconductor structure according to claim 1, wherein the topmost surface of the liner layer is lower than a topmost surface of the semiconductor substrate in a thickness direction of the semiconductor substrate after the etching process.

3. The manufacturing method of the semiconductor structure according to claim 2, wherein a height difference between the topmost surface of the liner layer and the topmost surface of the semiconductor substrate in the thickness direction of the semiconductor substrate is larger than or equal to 6 nanometers after the etching process.

4. The manufacturing method of the semiconductor structure according to claim 2, wherein a height difference between the topmost surface of the liner layer and the topmost surface of the semiconductor substrate in the thickness direction of the semiconductor substrate is larger than a height difference between a topmost surface of the isolation structure and the topmost surface of the semiconductor substrate in the thickness direction of the semiconductor substrate after the etching process.

5. The manufacturing method of the semiconductor structure according to claim 2, wherein a topmost surface of the isolation structure is higher than the topmost surface of the semiconductor substrate in the thickness direction of the semiconductor substrate after the etching process.

6. The manufacturing method of the semiconductor structure according to claim 1, wherein the noble gas implantation process comprises a xenon implantation process.

7. The manufacturing method of the semiconductor structure according to claim 1, wherein an etch rate of the liner layer in the etching process is increased by the implantation process.

8. The manufacturing method of the semiconductor structure according to claim 1, wherein an etch rate of the liner layer in the etching process is higher than an etch rate of the isolation structure in the etching process.

9. The manufacturing method of the semiconductor structure according to claim 1, wherein the etching process comprises a wet etching process using dilute hydrofluoric acid.

10. The manufacturing method of the semiconductor structure according to claim 1, wherein the step of forming the isolation structure comprises:

forming an isolation material in the isolation trench and on the patterned mask layer after the implantation process, wherein the isolation trench is filled with the isolation material and the liner layer; and performing a planarization process to remove the isolation material on the patterned mask layer and form the isolation structure partly in the isolation trench and partly outside the isolation trench.

11. The manufacturing method of the semiconductor structure according to claim 1, wherein the liner layer comprises a dielectric material.

12. The manufacturing method of the semiconductor structure according to claim 1, wherein the liner layer comprises a thermal oxide layer.

* * * * *